United States Patent
Van Der Schaar et al.

(10) Patent No.: US 8,264,664 B2
(45) Date of Patent: Sep. 11, 2012

(54) METHOD FOR PRODUCING A MARKER ON A SUBSTRATE, LITHOGRAPHIC APPARATUS AND DEVICE MANUFACTURING METHOD

(75) Inventors: Maurits Van Der Schaar, Veldhoven (NL); Jacobus Burghoorn, Haelen (NL); Richard Johannes Franciscus Van Haren, Waalre (NL); Everhardus Cornelis Mos, Eindhoven (NL); Rene Monshouwer, Leiden (NL)

(73) Assignee: ASML Netherlands B.V., Veldhoven (NL)

( * ) Notice: Subject to any disclaimer, the term of this patent is extended or adjusted under 35 U.S.C. 154(b) by 449 days.

(21) Appl. No.: 12/269,390

(22) Filed: Nov. 12, 2008

(65) Prior Publication Data
US 2009/0066921 A1   Mar. 12, 2009

Related U.S. Application Data

(62) Division of application No. 10/875,605, filed on Jun. 25, 2004, now Pat. No. 7,476,490.

(51) Int. Cl.
G03B 27/52 (2006.01)
G03B 27/42 (2006.01)
(52) U.S. Cl. ........... 355/30; 355/27; 355/53; 355/55
(58) Field of Classification Search ........... 355/30, 355/53, 55, 77, 27; 430/22, 292, 330, 311, 430/945, 966, 30, 328, 325
See application file for complete search history.

(56) References Cited

U.S. PATENT DOCUMENTS

| | | | |
|---|---|---|---|
| 4,741,622 A * | 5/1988 | Suwa et al. | 356/401 |
| 4,968,586 A | 11/1990 | Dominh | |
| 5,626,782 A * | 5/1997 | Maeda | 219/444.1 |
| 5,673,101 A * | 9/1997 | Tenner et al. | 355/53 |
| 5,824,455 A * | 10/1998 | Komatsu et al. | 430/323 |
| 6,034,771 A * | 3/2000 | Rangarajan et al. | 356/450 |
| 6,344,892 B1 * | 2/2002 | Sugita et al. | 355/53 |
| 6,416,922 B2 | 7/2002 | Sato et al. | |
| 6,494,552 B1 * | 12/2002 | Miyamoto et al. | 347/1 |
| 6,686,132 B2 * | 2/2004 | Cheng et al. | 430/325 |
| 7,199,812 B2 | 4/2007 | Endo et al. | |
| 2001/0001463 A1 * | 5/2001 | Hayasaki et al. | 219/497 |
| 2002/0182521 A1 * | 12/2002 | Fujisawa et al. | 430/22 |
| 2003/0064307 A1 * | 4/2003 | Nakamura et al. | 430/22 |
| 2004/0033448 A1 * | 2/2004 | Ito et al. | 430/394 |

(Continued)

FOREIGN PATENT DOCUMENTS

JP     60003689 A  *  1/1985

(Continued)

OTHER PUBLICATIONS

English translation of WO99/50893.*

(Continued)

*Primary Examiner* — Peter B Kim
*Assistant Examiner* — Christina Riddle
(74) *Attorney, Agent, or Firm* — Pillsbury Winthrop Shaw Pittman LLP

(57) ABSTRACT

A method of producing a marker on a substrate includes projecting a patterned beam on a layer of resist disposed on a substrate in a lithographic apparatus to create a latent marker; and locally heating the substrate at the marker location in the lithographic apparatus to transform the latent marker into a detectable marker.

10 Claims, 4 Drawing Sheets

U.S. PATENT DOCUMENTS

| | | | |
|---|---|---|---|
| 2004/0121617 A1* | 6/2004 | Kawano et al. | 438/781 |
| 2005/0079428 A1* | 4/2005 | Kanno | 430/30 |
| 2006/0141376 A1* | 6/2006 | Levy et al. | 430/30 |

FOREIGN PATENT DOCUMENTS

| | | | |
|---|---|---|---|
| JP | 01048415 A * | 2/1989 | |
| JP | 8-111370 A | 4/1996 | |
| JP | 11133572 A * | 5/1999 | |
| JP | 2001-207073 A | 7/2001 | |
| JP | 2003-167326 A | 6/2003 | |
| JP | 2004-134674 A | 4/2004 | |
| JP | 2004-145177 A | 5/2004 | |
| WO | 99/50893 A1 | 10/1999 | |

OTHER PUBLICATIONS

Patent Abstracts of Japan—Publication No. 63-110724, published May 16, 1988.

English Translation of Official Action issued on Aug. 26, 2008 in Japanese Application No. 2005-213413.

Office Action in related Japanese Patent Application 2005-213413 mailed Nov. 10, 2009.

* cited by examiner

METHOD FOR PRODUCING A MARKER ON A SUBSTRATE, LITHOGRAPHIC APPARATUS AND DEVICE MANUFACTURING METHOD

CROSS-REFERENCE TO RELATED APPLICATION

This application is a divisional of U.S. patent application Ser. No. 10/875,605, filed Jun. 25, 2004, the contents of which are incorporated herein by reference.

FIELD OF THE INVENTION

The present invention relates to lithographic apparatus and methods.

BACKGROUND

A lithographic apparatus is a machine that applies a desired pattern onto a target portion of a substrate. Lithographic apparatus can be used, for example, in the manufacture of integrated circuits (ICs). In that circumstance, a patterning structure, which is alternatively referred to as a mask or a reticle, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning structure" used herein should be broadly interpreted as referring to a structure that can be used to impart a beam of radiation with a pattern in its cross-section such as to create a pattern in a target portion of the substrate. It should be noted that the pattern imparted to the beam of radiation may not exactly correspond to the desired pattern in the target portion of the substrate. Generally, the pattern imparted to the beam of radiation will correspond to a particular functional layer in a device being created in the target portion, such as an integrated circuit.

A patterning structure may be transmissive or reflective. Examples of patterning structures include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning structure. It holds the patterning structure in a way depending on the orientation of the patterning structure, the design of the lithographic apparatus, and other conditions, such as for example whether or not the patterning structure is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning structure is at a desired position, for example with respect to the projection system. Any use of the terms "reticle" or "mask" herein may be considered synonymous with the more general term "patterning structure".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components configured to direct, shape, or control the beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

It may be desirable to project the beam of radiation imparted with a pattern in its cross-section accurately to the substrate (e.g. with respect to one or more features or process layers already formed on the substrate, or with respect to a predetermined characterization of the substrate surface). In such cases, it may be desirable to know the relative position of the substrate with respect to the reticle, in order to position the substrate in the focal plane of the projection system that is located optically between the reticle and the substrate. Therefore, it may be desirable to measure accurately the position of the substrate. This measurement may for instance be done by, in an operation, determining the position of the substrate with respect to the substrate table carrying the substrate. In another operation, the relative position of the substrate table is determined with respect to the reticle. These two measurements together can be used to compute the relative position of the substrate with respect to the reticle. However, it will be understood that several other strategies may be used to determine the relative position of the reticle with respect to the substrate, for instance by directly determining their relative position or by determining the relative position of the substrate with respect to the reticle table. It is implicit in these strategies that the position of the substrate is determined with respect to the position of another object (for example, the substrate table, the reticle table, or the reticle).

Several methods are known to a person skilled in the art to determine the relative position of a substrate with respect to another object. For instance, in case the relative position is determined with respect to the substrate table, the substrate and the substrate table are both provided with alignment markers. The substrate may be provided, for example, with up to 30 alignment markers. First the positions of some or all of the alignment markers on the substrate and the substrate table are determined. This procedure may be done by providing an alignment beam to a first alignment mark. The first alignment marker is positioned in the alignment beam by moving the substrate table, while monitoring the position of the substrate table with interferometric devices. By performing measurements to the diffraction pattern generated by the alignment marker in combination with the alignment beam, the position of the substrate table for which the alignment marker is optimally positioned with respect to the alignment beam can be determined. This operation may be done for some or all of the alignment markers (on the substrate as well as on the substrate table). By comparing the readings of the interferometric devices monitoring the position of the substrate table that correspond to different positions of the alignment markers, the relative position of the substrate with respect to the substrate table can be determined.

However, any other known method may be used to determine the relative position of a substrate with respect to another object. Most of these alignment techniques use alignment markers provided on the substrate. Therefore, use of such techniques may require that alignment markers are provided on the substrate. Such measuring markers may be provided to the substrate by projecting an alignment marker pattern to a layer of resist provided on top of the substrate.

After the exposure, the alignment markers are latently present, and the substrate is transported out of the lithographic exposure apparatus to a place where the latent alignment markers can be made visible, i.e. the alignment marker is made detectable for the alignment arrangement used. This is usually done in a track, as will be known to a person skilled in the art. In such a track, a post exposure bake (PEB) may be carried out in which the substrate is heated to a certain suitable temperature in order to make the latent alignment marker visible, as will be known to a person skilled in the art. After this, the substrate may be transported back into the lithographic apparatus where the alignment markers can be used for determining the relative position of the substrate as described above.

Transporting the substrate out of the lithographic apparatus to the track, where the latent markers are made visible, and transporting the substrate back in to the lithographic apparatus is a time-consuming process and therefore reduces the throughput of the system. This transportation process may also lead to inaccuracies, since the substrate is removed from the substrate table and repositioned on the substrate table after treatment in the track. For example, it will be understood that the substrate may not be in the exact same position with respect to the substrate table after repositioning as it was before removal from the substrate table.

SUMMARY

Embodiments of the invention include a method of producing a marker on a substrate, including projecting a patterned beam on a layer of resist disposed on a substrate in a lithographic apparatus to create a latent marker; and locally heating the substrate at the marker location in the lithographic apparatus to transform the latent marker into a detectable marker.

According to another embodiment of the invention including: providing a substrate; using the method as described above to produce at least one marker on the substrate; providing a beam of radiation using an illumination system; aligning said substrate to a patterning structure by using the at least one marker on the substrate; using the patterning structure to impart the beam with a pattern in its cross-section; and projecting the patterned beam of radiation onto a target portion of the substrate.

In an embodiment of the invention, there is provided a device manufacturing method including: using the method mentioned previously to produce at least one marker on a substrate; aligning the substrate to a patterning structure by using the at least one marker on the substrate; patterning a beam of radiation with a pattern in its cross-section using the patterning structure; and projecting the patterned beam of radiation onto a target portion of the substrate.

According to an embodiment of the invention, there is provided a lithographic apparatus including: an illumination system for providing a beam of radiation; a support structure for supporting a patterning structure, the patterning structure serving to impart the beam with a pattern in its cross-section; a substrate table for holding a substrate; and a projection system for projecting the patterned beam onto a target portion of the substrate, wherein the lithographic apparatus includes an internal device for locally heating the substrate, in order to transform a latent marker on the substrate into a detectable marker.

In another embodiment of the invention, there is provided a lithographic apparatus including: an illumination system configured to provide a beam of radiation; a support structure configured to support a patterning structure, the patterning structure serving to impart the beam of radiation with a pattern in its cross-section; a substrate table configured to hold a substrate; a projection system configured to project the patterned beam onto a target portion of the substrate; and an internal device configured to locally heat the substrate to transform a latent marker on the substrate into a detectable marker.

According to an embodiment of the invention, the device configured to locally heat the substrate includes a heat generating element, and the lithographic apparatus is configured to bring the heat generating element and the latent marker in the vicinity of each other or to press the heat generating device and the latent marker against one another.

According to an embodiment of the invention, the lithographic apparatus includes a device configured to apply electrical energy to the heat generating element.

According to an embodiment of the invention, the lithographic apparatus includes a radiation emitting device configured to provide a radiation beam to the heat generating element.

According to an embodiment of the invention, the lithographic apparatus includes a radiation emitting device configured to provide a radiation beam to the latent marker.

According to an embodiment of the invention, the lithographic apparatus includes a magnetically device configured to provide an alternating magnetic field to the latent marker.

According to an embodiment of the invention, the lithographic apparatus includes an exhaust device configured to perform suction in the vicinity of the marker.

According to yet another embodiment, there is provided a lithographic apparatus including an illumination system configured to provide a beam of radiation; a support structure configured to support a patterning structure, the patterning structure serving to impart the beam of radiation with a pattern in its cross-section; at least one substrate table configured to hold a substrate; a projection system configured to project the patterned beam onto a target portion of the substrate; and an internal device configured to locally heat the substrate on the at least one substrate table to transform a latent marker on the substrate into a detectable marker.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
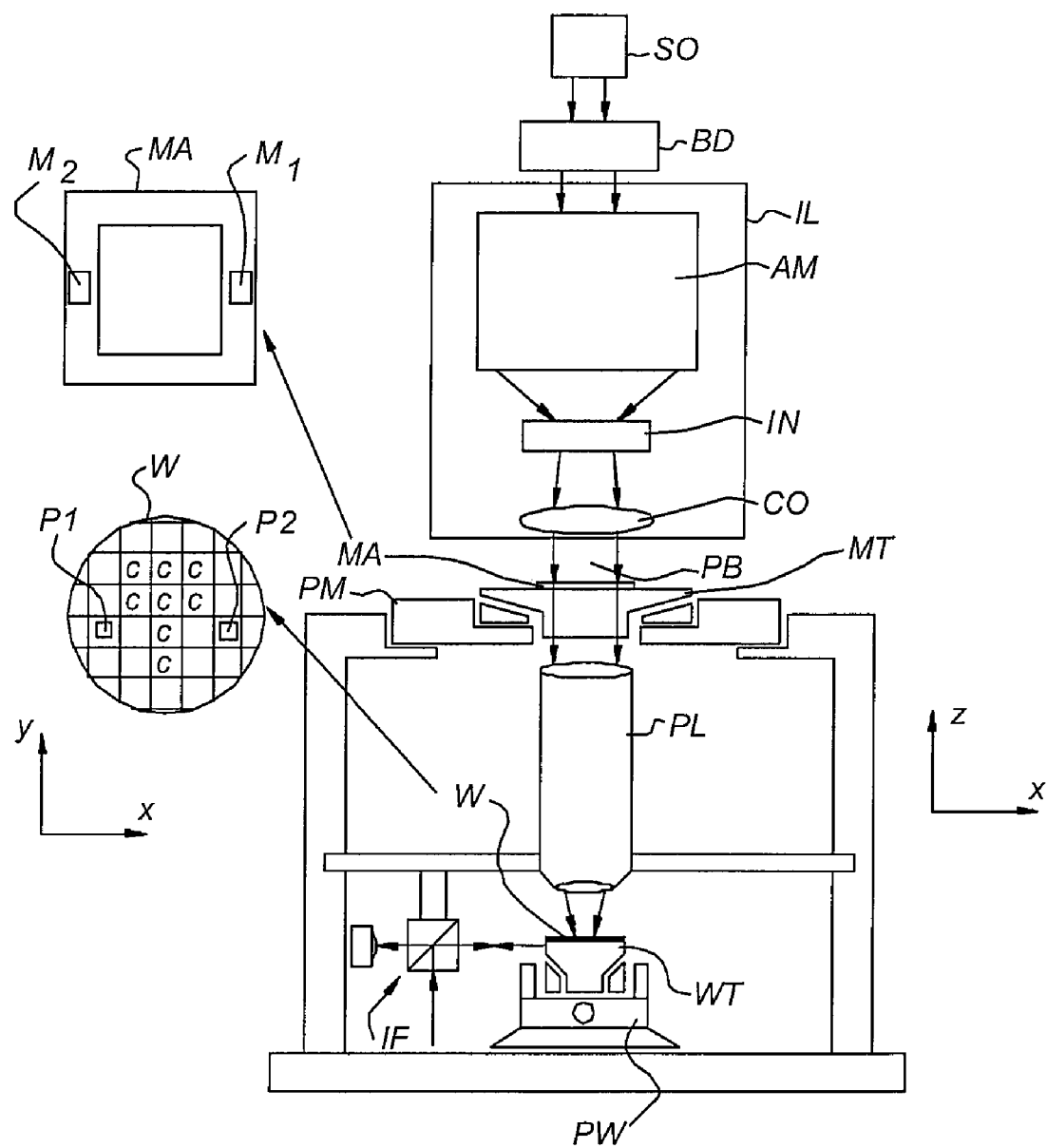
FIG. 1 depicts a lithographic apparatus according to an embodiment of the invention.

FIG. 1 schematically depicts a lithographic apparatus according to an embodiment of the invention. The apparatus includes an illumination system (illuminator) IL configured to provide a beam PB of radiation (e.g. UV radiation or EUV radiation) and a first support structure (e.g. a mask table) MT configured to support a patterning structure (e.g. a mask) MA and connected to a first positioning device PM configured to accurately position the patterning structure with respect to the projection system ("lens"), item PL. The apparatus also includes a substrate table (e.g. a wafer table) WT configured to hold a substrate (e.g. a resist-coated wafer) W and connected to a second positioning device PW configured to accurately position the substrate with respect to the projection system ("lens"), item PL, the projection system (e.g. a refractive projection lens) PL being configured to image a pattern imparted to the beam of radiation PB by a patterning structure MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may include an adjusting structure AM configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator includes a conditioned beam of radiation, referred to as the beam of radiation PB, having a desired uniformity and intensity distribution in its cross-section.

The beam of radiation PB is incident on the mask MA, which is held on the mask table MT. Having traversed the mask MA, the beam of radiation PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment markers M1, M2 and substrate alignment markers P1, P2.

The depicted apparatus can be used in the following preferred modes:

1. In step mode, the mask table MT and the substrate table WT are kept essentially stationary, while an entire pattern imparted to the beam of radiation is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the beam of radiation is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning structure, and the substrate table WT is moved or scanned while a pattern imparted to the beam of radiation is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above described modes of use or entirely different modes of use may also be employed.

In at least some applications of embodiments of the invention, the latent alignment markers are made detectable in the lithographic apparatus by performing a local post exposure bake. For example, in some embodiments such an operation may be done at the exposure position. In case the lithographic apparatus has two or more substrate tables, this operation may be done, in other embodiments, at a position remote from the exposure position, but inside the lithographic apparatus (e.g. at a measurement, alignment, or load station).

In order to transform a latent marker into a detectable mark, a local post exposure bake is performed inside the lithographic apparatus. By locally heating the substrate, i.e. at the locations of the latent alignment markers, the latent alignment markers can be made detectable without the need for transporting the substrate out of the lithographic apparatus. Also there is no need to remove the substrate W from the substrate table WT.

The term "latent marker" used herein broadly refers to a marker which has a contrast too low to allow successful and reliable detection of the mark. By applying a post exposure bake, the contrast of the latent marker is increased to allow successful and reliable detection.

Different embodiments of the invention will be described below.

Figure 2A:
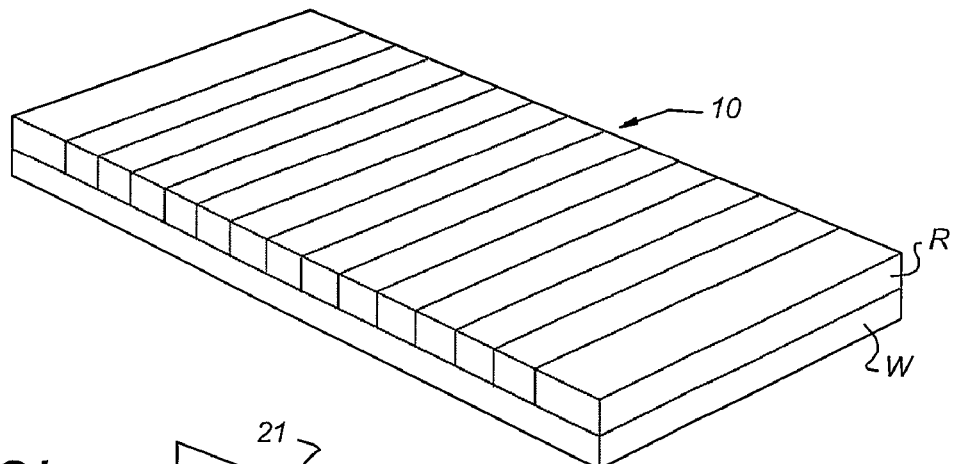
FIGS. 2a, 2b, 2c depict a substrate according to an embodiment of the invention.
Figure 2B:
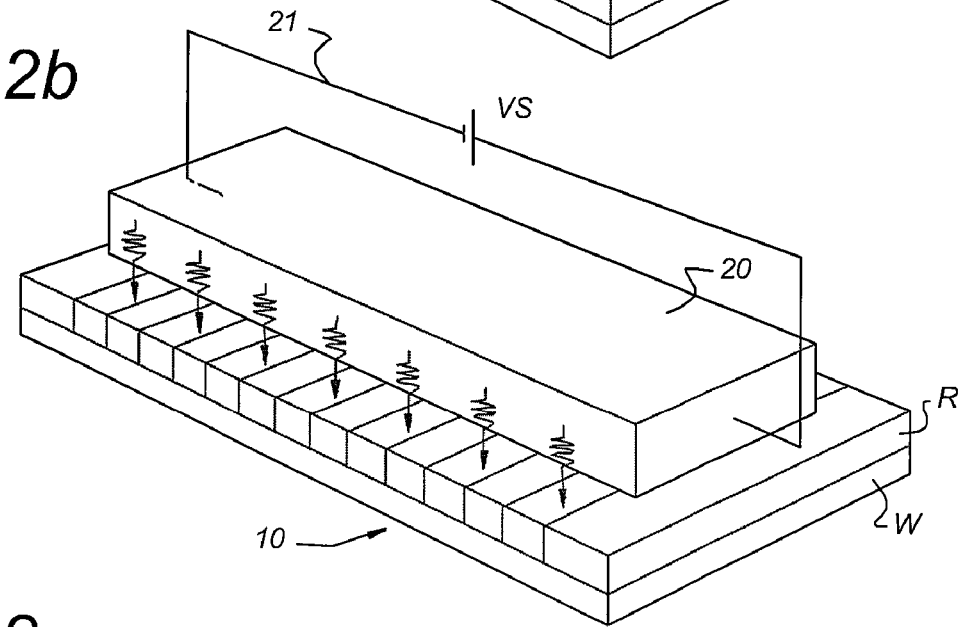
Figure 2C:
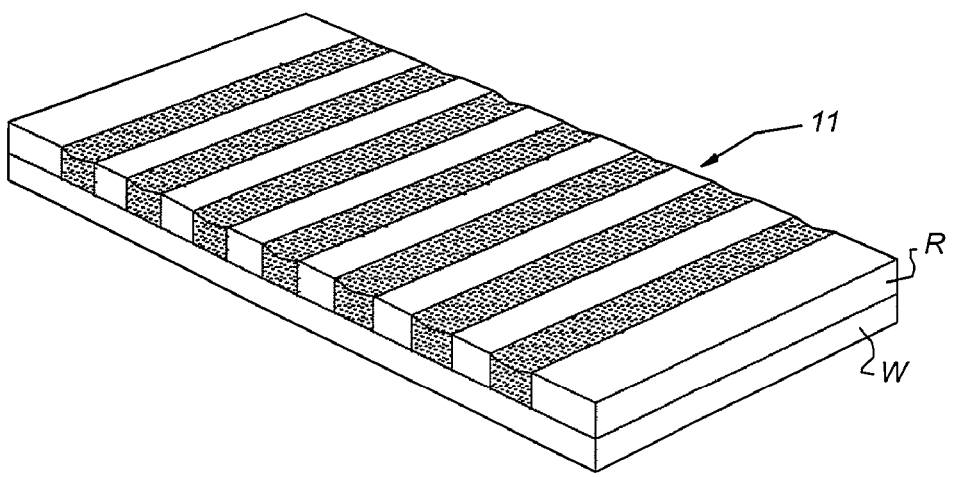

FIGS. 2a, 2b and 2c show an embodiment of the present invention. FIG. 2a shows part of a substrate W with a layer of resist R on top of it. In the layer of resist R a latent alignment marker 10 is provided. This latent alignment marker 10 may be provided by projecting an alignment marker pattern to the layer of resist R, in a way known to a person skilled in the art. For example, some or all of the rest of the layer of resist may be masked during this projecting, or may otherwise remain unexposed, such that another pattern may be applied to an unexposed part of the layer of resist e.g. at a later time.

FIG. 2b shows a heat producing element 20, that is brought in the vicinity of the latent alignment marker 10. The heat producing element 20 may be any kind of heat producing element known to a person skilled in the art.

According to an embodiment of the invention, the heat producing element 20 may be, for example, a plate (e.g. of platinum) which is connected to a wire 21 (e.g. of silver (Ag)). The dimensions of the heat producing element 20 are comparable with the latent alignment marker 10, for example approximately 100 µm-40 µm. However, the heat producing element 20 may be slightly smaller than the latent alignment marker (e.g. in order to prevent unnecessary heating of the resist surrounding the latent alignment marker 10).

The diameter of the Ag-wire 21 may be larger than the diameter of the heat producing element 20, although this is not shown as such in FIG. 2b. By providing a wire with a relative large diameter with respect to the heat producing element 20, the heat producing element 20 has a relatively high resistance with respect to the wire and a relatively large amount of heat is therefore produced in the heat generating element 20, and not in the wire 21. Such a wire is known to a person skilled in the art as a "Wollaston wire." For example, the wire may be formed as a thin platinum wire with a jacket of silver, wherein the jacket is removed (e.g. etched) from one portion of the wire to form the heat generating element 20.

The Ag-wire is connected to a voltage source VS. Via the Ag-wire 21, a voltage can be applied to the heat producing element 21. This may be, for example, a DC voltage source, an AC voltage source, or a pulse-width-modulation (PWM) source. As a result of the voltage applied, a current will flow through the Ag-wire 21 and the heat producing element 20. It will be understood that the increase of the temperature is substantially proportional to the applied voltage. The same result can be obtained by using a current source.

The heat producing element 20 may be brought in the vicinity of the latent marker 10. In order to do this the heat producing element 20 may be connected to a robot arm to move the heat producing element 20 to the desired position. However, the heat producing element 20 may also be positioned on a fixed position in the lithographic apparatus. In that case, the substrate W may be moved to that fixed position with respect to the heat producing element 20. As the substrate W is positioned on a substrate table WT that is configured to move, this may be an advantageous way of bringing the heat generating element 20 close to the latent marker 10. In an embodiment of the invention, a combination of these two embodiments may be used, i.e. the heat producing element 20 and the substrate W can both be moved (for example, the heat producing element 20 may be moved to a fixed position, or may be otherwise coarsely positioned, with the substrate W being moved to complete the desired positional relation).

In an embodiment of the invention, the heat producing element 20 may also be brought in contact with the latent marker 10. This can be accomplished by moving the substrate table WT and/or the heat producing element 20. Care should be taken that the applied pressure does not exceed a predetermined threshold pressure, above which damage may be caused to the layer of resist R. The pressure applied can be monitored with one or more pressure sensors (not shown) using, for example, the positioning device PW for this purpose and/or, e.g., an arm or other structure carrying the heat producing element 20.

In principle, the local post exposure bake by the heat producing element 20 may cause local deformations in the layer of resist R due to local expansion, which may result in internal stress in the material. However, it should be noted that the markers are relatively small and may be positioned outside the target areas C on the substrate W, such that these deformations would be relatively harmless. It will also be appreciated that these internal stresses are relatively small and will disappear after the heated area cools down. The silicon material is further known to quickly transport (e.g. diffuse) the heat, i.e. within milliseconds.

FIG. 2c shows a possible result of the post exposure bake. The latent marker 10 is transformed into a marker 11 that can easily and reliably be detected by an alignment system. The optical characteristics of the latent marker 10 are changed and allow detection. The morphology of the latent marker 10 may have changed as can be seen from FIG. 2c. In this example, the exposed portions are slightly depressed after the local bake.

It will be understood that the local exposure bake can be performed inside the lithographic projection apparatus, and does not need to be done outside the lithographic projection apparatus. According to an embodiment of the invention, there is no need to remove the substrate W from the substrate table WT, which may increase the accuracy of the process. Also, there is no need to transport the substrate W out the lithographic projection apparatus, which may be rather time-consuming.

Figure 3A:
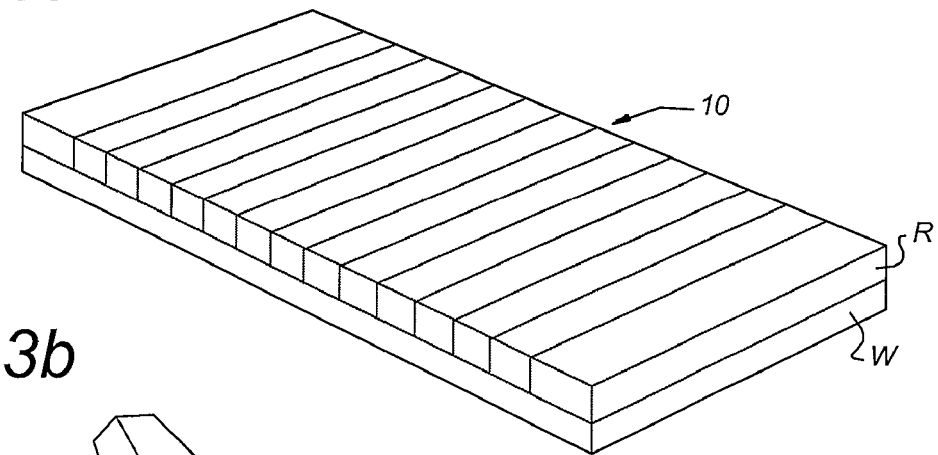
FIGS. 3a, 3b, 3c depict a substrate according to an embodiment of the invention.
Figure 3B:
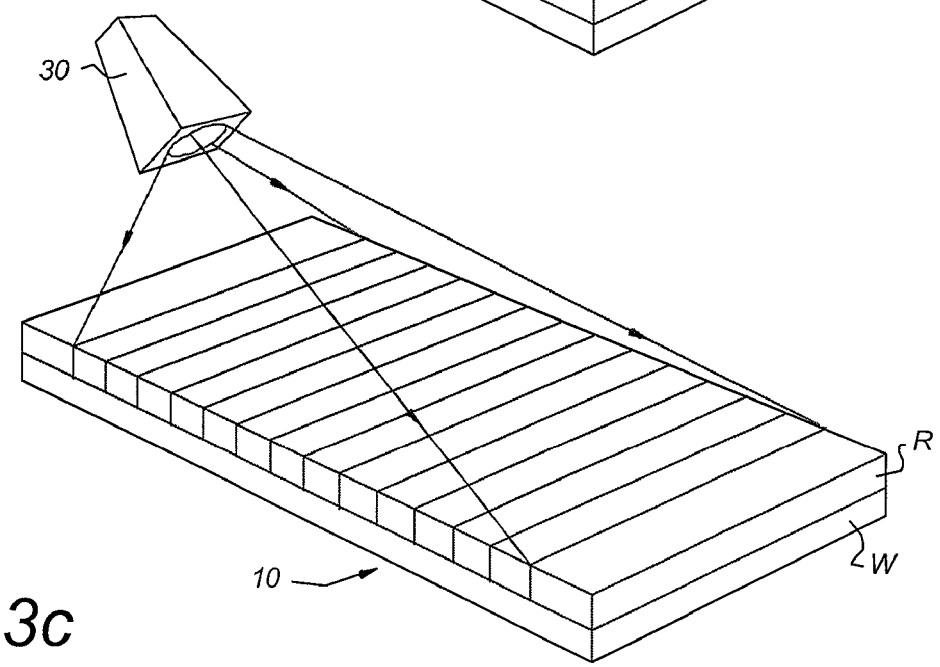
Figure 3C:
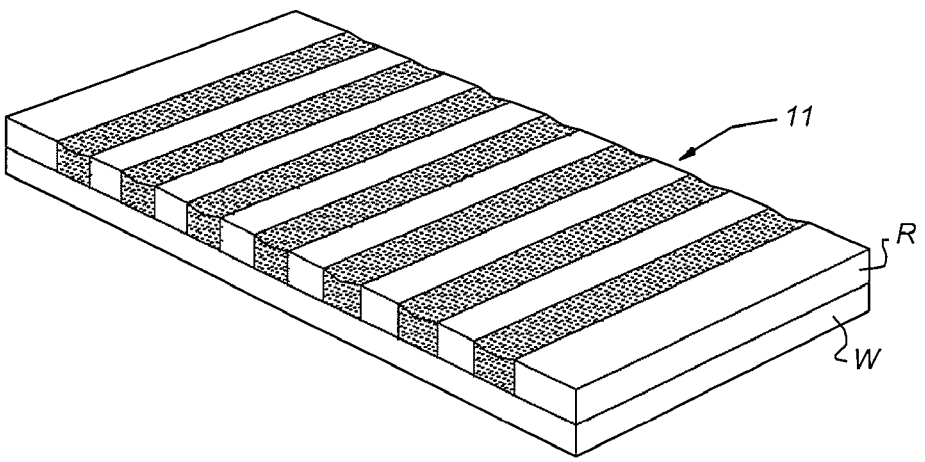

FIGS. 3a, 3b and 3c schematically depict an alternative embodiment of the present invention. According to this embodiment of the invention, the local post exposure bake is carried out by locally heating the latent alignment marker 10 with a radiation emitting device, such as a laser device 30. FIG. 3a is similar to FIG. 2a, depicting a latent marker 10. FIG. 3b schematically depicts a laser device 30 that produces a laser beam that is projected on the latent marker 10. The wavelength of the beam generated by the laser 30 should be such that the laser beam is sufficiently absorbed by the layer of resist R. The wavelength may therefore be chosen based on the characteristics of the layer of resist R. In an embodiment of the invention, an (deep) infrared red laser device 30 may be used having, for example, a wavelength of 3-10 μm.

Also it may be desirable to choose the intensity of the laser beam carefully, i.e. it should be high enough to quickly achieve the desired local post exposure bake, but it should not be too high, in order to prevent affecting the resist surrounding the latent marker 10. It may be desirable to choose the characteristics of the laser beam such that chemical reaction in the resist surrounding the latent marker 10 is prevented, or at least minimized.

Experiments have shown that laser beams having a wavelength of approximately 9,5-10 μm and laser beams having a wavelength of approximately 2-3 μm are suitable for performing a local post exposure bake. The required intensity depends on many factors, such as the resist used.

It will be appreciated that embodiments as shown in FIG. 3 may be applied to provide a quick and accurate local post exposure bake, without the need to physically contact the substrate W.

Figure 4:
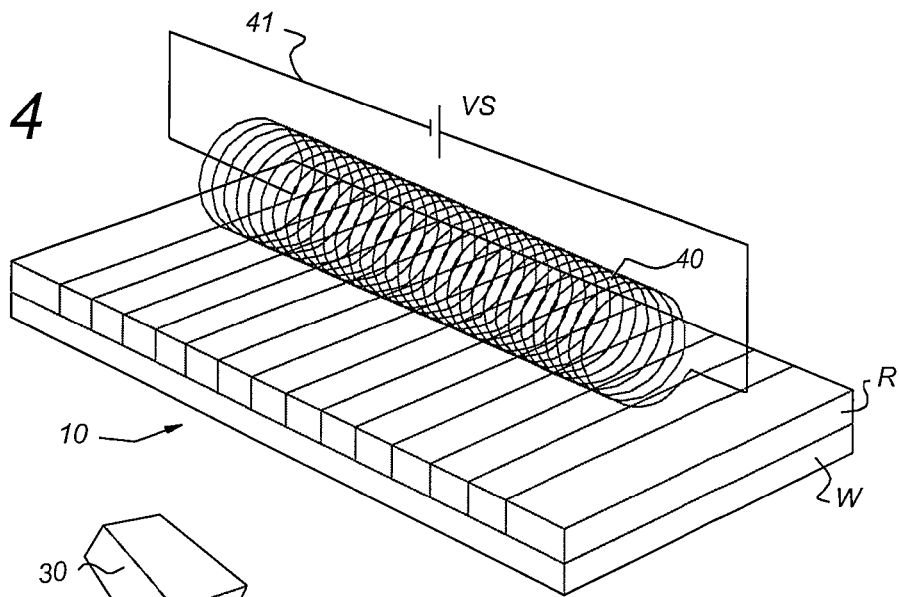
FIG. 4 depicts a substrate according to an embodiment of the invention.

According to another embodiment, the local post exposure bake is done by local induction heating, e.g. by locally applying an alternating magnetic field to the latent alignment marker 10. This may be done using a magnetic device, such as a coil 40, as depicted in FIG. 4. An alternating voltage source VS (or current source) is connected to the coil 40 via wires 41 and an alternating magnetic field is produced. The heating process is based on an effect that is similar to the heating process used in microwaves, as will readily be understood by a person skilled in the art.

Figure 5:
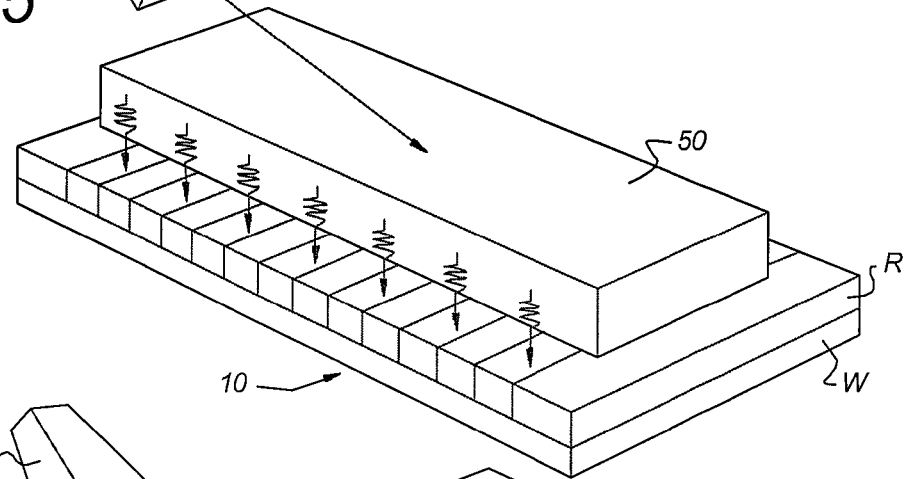
FIG. 5 depicts a substrate according to an embodiment of the invention.

According to another embodiment, a combination of embodiment 1 and 2 may be applied, as depicted in FIG. 5. Since it is not always easy to provide a laser device 30 that produces the desired wavelength that has the right characteristics, i.e. enough absorption in the layer of resist R, a heat generating element 50 may be brought in the vicinity or in contact with the latent marker 10. The heat generating element 50 is then heated by projecting a laser beam upon it, using a laser device 30. One potential advantage of such an alternative is that it may not be necessary to provide wiring 21 to the heat generating element 20 in the vicinity of the latent marker 10. Another potential advantage is ease of use with different resists having different characteristics. The laser device 30 does not necessarily have to have a wavelength with sufficient absorption in the layer of resist R, but should have a wavelength to create enough absorption by the material of the heat producing element 50, of which the material may be chosen freely.

In one embodiment, radiation source SO may be used to heat the heat generating element 50. This may simply be done by positioning the heat generating element in the focal plane of the radiation source and positioning the substrate W such that it is in the vicinity of the heat generating device 50. In case the local post exposure bake is performed at a remote position, this may also be done by tapping part of the exposure beam generated by the radiation source 50, guide it to the remote position and use it for the local post exposure bake.

As already discussed above, the local heating of the resist may cause outgassing of the resist. As a result of this, contamination particles released from the resist or otherwise resulting from outgassing may contaminate the lithographic apparatus and negatively influence its performance. In particular, particles that contaminate the projection lens PL may negatively influence the lithographic apparatus. Therefore, in an embodiment of the invention, the local post exposure bake may be performed at a position remote from the projection lens PL.

For example, in case a multiple stage machine is used, the stage may easily be moved away from the exposure position. In such a multiple stage machine, usually two stations are provided: a measurement station and an exposure station. At the measurement station, measurements, such as height measurements, may be performed. Next, the substrate W and the substrate table WT are moved to the exposure station, where the measurements obtained at the measurement station are used (e.g. to position the substrate with respect to the projection lens). This concept is known to a person skilled in the art.

In order to reduce the negative effects of outgassing and, in particular, the contamination of the projection lens PL, the local post exposure bake may be performed at one or more positions at the measurement station. However, it may also be possible to perform the local post exposure bake at a different location in the projection apparatus.

Moving the substrate stage WT and the substrate W away from the projection lens PL may also be done in a single stage machine.

Figure 6:
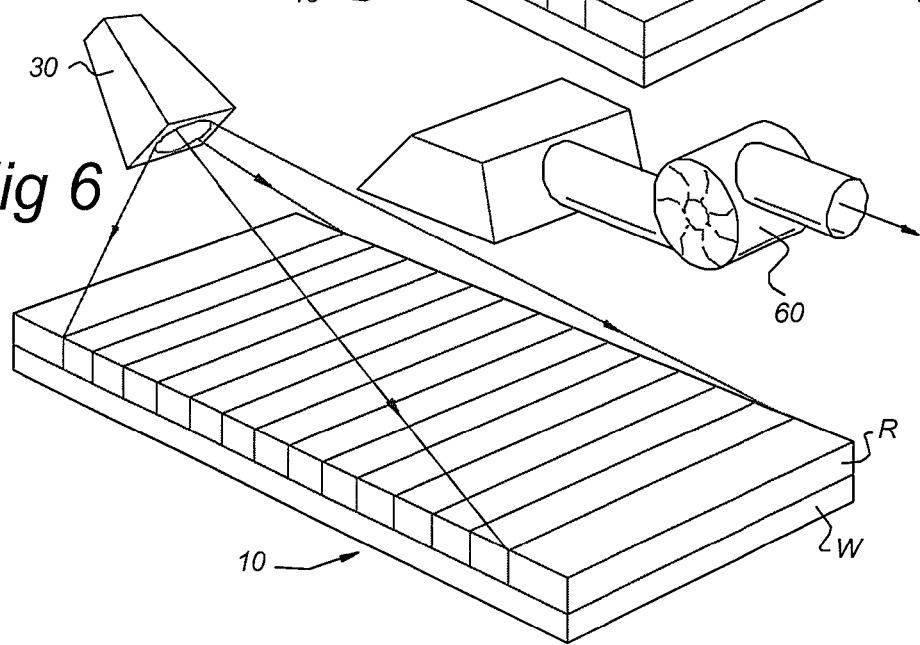
FIG. 6 depicts a substrate according to a further embodiment of the invention.

The negative effects of contamination due to outgassing may also be further reduced by providing an exhaust device 60, that is arranged to remove contamination particles by suction. FIG. 6 shows an embodiment of such an exhaust device 60 that is provided above the marker 10 that is heated with laser device 30, as already described with reference to FIG. 3b. The strength of suction should be chosen appropriately. If the suction is too strong, this may negatively influence the flow conditions in the lithographic apparatus. The suction may be performed during the local post exposure bake, but may also be performed or continued after the local post exposure bake has been finished. It will be appreciated that in use the exhaust device 60 may be positioned in the vicinity of the marker.

By locally heating the substrate at the marker location, the marker may be made detectable for a sensor in a fast way. One potential advantage is that time and energy are not wasted on heating the whole substrate, but only the relevant part of the substrate is heated.

In some applications, the local heating, or local post exposure bake, can easily be performed on the substrate table on which the substrate is positioned during exposure, and no time is wasted transporting the substrate out of the lithographic projection apparatus and removing it from the wafer table. No time is wasted transporting the substrate back in the lithographic projection apparatus, positioning it on the substrate table. Also, there may be no need in such cases to reposition the substrate on the substrate table when it is transported back in the lithographic projection apparatus. Such a method may therefore be more accurate and less time consuming, and thus may increase the quality and/or throughput of the system.

A marker has typical dimensions of 100×100 micron, which is a relatively small surface area of the substrate, although principles of the invention may be applied to uses of markers and/or substrates of other dimensions. Since the local post exposure bake is only applied to the latent marker, a relatively small amount of contamination particles may possibly be released due to outgassing of the resist. In order to further minimize the risk of contamination particles contaminating lenses and/or mirrors, the local post exposure bake may be performed on a location remote from such lenses and/or mirrors. In case a multiple stage machine is used, the local post exposure bake may be performed on a position remote from the projection lens.

According to an embodiment, the local heating may be performed by providing a heat generating element in the vicinity of the latent marker. This technique may be an easy way of performing a local post exposure bake. It is possible to transport the heat generating element to the latent marker, but it is also possible to transport the substrate towards the heat generating element.

According to an embodiment, the heat generating element may be pressed against the latent marker. This operation may be done in order to ensure a fast and accurate heat transport from the heat generating element to the latent marker.

According to an embodiment, the heat generating element may be heated by one of applying electrical energy to the heat generating element and projecting a radiation beam to the heat generating element. These techniques may be easy ways of heating the heat generating element.

According to an embodiment, the local heating may be performed by one of providing a radiation beam to the latent marker and providing an alternating magnetic field to the latent marker. These techniques may be easy and accurate ways of directly heating the latent marker.

According to an embodiment, the method further includes performing suction in the vicinity of the marker. By performing suction, contamination particles may be removed that result from outgassing due to the local post exposure bake.

While specific embodiments have been described above, it will be appreciated that the invention may be practiced otherwise than as described. In addition, embodiments also include computer programs (e.g. one or more sets or sequences of instructions) to control a lithographic apparatus to perform a method as described herein, and storage media (e.g. disks, semiconductor memory) storing one or more such programs in machine-readable form. The description is not intended to limit the invention.

We claim:

1. A lithographic apparatus comprising:
    an illumination system configured to condition a beam of radiation;
    a support structure configured to support a patterning structure, the patterning structure serving to impart the beam of radiation with a pattern in the radiation beam's cross-section;
    a substrate table configured to hold a substrate;
    a projection system configured to project the patterned beam onto a target portion of the substrate; and
    an internal heat generating device located within the lithographic apparatus and a heat generating portion of the heat generating device being positionable proximate the substrate and operable to locally heat the substrate to transform a latent marker on said substrate into a detectable marker, the internal heat generating device further comprising a heat generating element located within the lithographic apparatus, the heat generating element being heated to cause the local heating of the substrate to transform the latent marker.

2. A lithographic apparatus according to claim 1, wherein the lithographic apparatus is configured to bring at least one of the heat generating element and the latent marker into the vicinity of the other.

3. A lithographic apparatus according to claim 2, wherein the lithographic apparatus comprises a device configured to apply electrical energy to the heat generating element, thereby heating the heat generating element.

4. A lithographic apparatus according to claim 2, wherein the lithographic apparatus comprises a radiation emitting device configured to provide a radiation beam to the heat generating element, thereby heating the heat generating element.

5. A lithographic apparatus according to claim 1, wherein the lithographic apparatus comprises an exhaust device configured to perform suction in the vicinity of the marker.

6. A lithographic apparatus according to claim 1, wherein the apparatus is configured to locally heat the substrate on said at least one substrate table.

7. A lithographic apparatus according to claim 6, wherein said at least one substrate table is moveable from a measurement position to an exposure position and wherein the local heating of said substrate is performed at said measurement position.

8. A lithographic apparatus as in claim 1, wherein the heat generating element is heated to a temperature sufficient to effect the local heating of the substrate.

9. A lithographic apparatus comprising:
    an illumination system configured to condition a beam of radiation;
    a support structure configured to support a patterning structure, the patterning structure serving to impart the beam of radiation with a pattern in the radiation beam's cross-section;
    a substrate table configured to hold a substrate;
    a projection system configured to project the patterned beam onto a target portion of the substrate; and
    an internal heat generating device located within the lithographic apparatus and a heat generating portion of the heat generating device being positionable proximate the substrate and operable to locally heat the substrate to transform a latent marker on said substrate into a detectable marker, the internal heat generating device further comprising a heat generating element located within the lithographic apparatus, the heat generating element being heated during local heating of the substrate wherein the internal heat generating device is configured to provide an alternating magnetic field to the latent marker, thereby inductively heating the latent marker.

10. A lithographic apparatus comprising:
    an illumination system configured to condition a beam of radiation;
    a support structure configured to support a patterning structure, the patterning structure serving to impart the beam of radiation with a pattern in the radiation beam's cross-section;
    a substrate table configured to hold a substrate;

a projection system configured to project the patterned beam onto a target portion of the substrate; and an internal heat generating device located within the lithographic apparatus and a heat generating portion of the heat generating device being positionable proximate the substrate and operable to locally heat the substrate to transform a latent marker on said substrate into a detectable marker;

wherein the internal heat generating device further comprises a heat generating element, and wherein the lithographic apparatus is configured to press the heat generating element and the latent marker into physical contact with one another.

* * * * *